United States Patent
Nakamichi et al.

(10) Patent No.: US 8,270,163 B2
(45) Date of Patent: Sep. 18, 2012

(54) DISPLAY APPARATUS

(75) Inventors: Masaya Nakamichi, Kizugawa (JP); Shohei Takahashi, Daito (JP)

(73) Assignee: Sanyo Electric Co., Ltd., Osaka (JP)

( * ) Notice: Subject to any disclaimer, the term of this patent is extended or adjusted under 35 U.S.C. 154(b) by 231 days.

(21) Appl. No.: 12/871,985

(22) Filed: Aug. 31, 2010

(65) Prior Publication Data

US 2011/0051367 A1   Mar. 3, 2011

(30) Foreign Application Priority Data

Aug. 31, 2009  (JP) ................. 2009-200866
Aug. 31, 2009  (JP) ................. 2009-200867

(51) Int. Cl.
*H05K 7/20* (2006.01)
(52) U.S. Cl. ........ 361/695; 361/694; 361/696; 361/699; 361/700; 361/701
(58) Field of Classification Search ............. 361/679.46, 361/679.47, 679.48, 679.53, 690–696, 688, 361/689, 7 01; 165/80.3, 80.4, 104.33, 104.34, 165/121–126, 185; 454/184; 62/259.2
See application file for complete search history.

(56) References Cited

U.S. PATENT DOCUMENTS

| | | | |
|---|---|---|---|
| 5,801,632 A * | 9/1998 | Opal | 340/585 |
| 6,490,874 B2 * | 12/2002 | Chu et al. | 62/93 |
| 2006/0077636 A1 * | 4/2006 | Kim | 361/688 |
| 2008/0148609 A1 * | 6/2008 | Ogorevc | 40/463 |
| 2009/0185348 A1 * | 7/2009 | Bretschneider et al. | 361/695 |
| 2009/0310059 A1 * | 12/2009 | Kim et al. | 349/58 |

FOREIGN PATENT DOCUMENTS

JP    2005-286987    10/2005

* cited by examiner

*Primary Examiner* — Michail V Datskovskiy
(74) *Attorney, Agent, or Firm* — Novak Druce DeLuca + Quigg, LLP

(57) ABSTRACT

A display apparatus includes an accommodation chamber having a sealed structure, a display panel accommodated in the accommodation chamber, a cooling part which cools the air inside the accommodation chamber, a drain pipe extending from a bottom part of the accommodation chamber, and a check valve provided in the drain pipe.

4 Claims, 5 Drawing Sheets

DISPLAY APPARATUS

The Japanese patent applications Number 2009-200866 and 2009-200867, upon which this patent application is based, are hereby incorporated by reference.

BACKGROUND OF THE INVENTION

1. Field of the Invention

The present invention relates to a display apparatus with a cooling device.

2. Description of Related Art

In recent years, flat panel display apparatuses for outdoor installation have appeared. In such an apparatus, in order to protect the panel from weather, dust and the like, it is considered to arrange the panel inside an accommodation chamber having a sealed structure.

However, since the air inside the chamber does not contact outside air, a temperature difference occurs between the outside air and the air inside the chamber when the outside air temperature falls. When the temperature of the outside air becomes lower than the temperature inside the chamber, moisture included in the air inside the chamber is condensed to dew drop on an inner surface of a glass portion provided in front of the panel, and as a result, the inner surface is misted and it may deteriorate the visibility of a screen of the panel.

Further, when the panel is accommodated in the chamber, the temperature in the chamber tends to increase due to the heat generated from the panel. Therefore, the temperature of the panel could rise to deteriorate the function of the panel, and it may result in inability of the panel to display images.

In order to inhibit temperature increase in the chamber, it is considered to accommodate a cooling device for cooling the air in the chamber inside the chamber. According to this structure, temperature increase of the panel is inhibited, and the function of the panel is maintained in normal state.

When the air in the chamber is cooled by the cooling device, moisture included in the air inside the chamber is condensed to dew drop on a surface of the cooling device, and thereby the moisture is reduced temporarily. However, since the dew condensed water is left untreated, the condensed water evaporates and is contained in the air inside the chamber again, when the cooling device stops its operation. Therefore, although the amount of the moisture included in the air inside the chamber is reduced temporarily, the amount is restored when the cooling device stops its operation. Accordingly, the inner surface of the glass portion cannot be prevented from being misted.

SUMMARY OF THE INVENTION

A display apparatus according to the present invention comprises an accommodation chamber having a sealed structure, a display panel accommodated in the accommodation chamber, a cooling part which cools the air inside the accommodation chamber, a drain pipe extending from a bottom part of the accommodation chamber, and a check valve provided in the drain pipe.

Another display apparatus according to the present invention comprises an accommodation chamber having a sealed structure, a display panel accommodated in the accommodation chamber, an evaporator which cools the air inside the accommodation chamber, and a drain outlet provided below the evaporator.

DETAILED DESCRIPTION OF THE PREFERRED EMBODIMENT

A display apparatus according to an embodiment of the present invention is discussed in detail below with reference to drawings.

Figure 1:
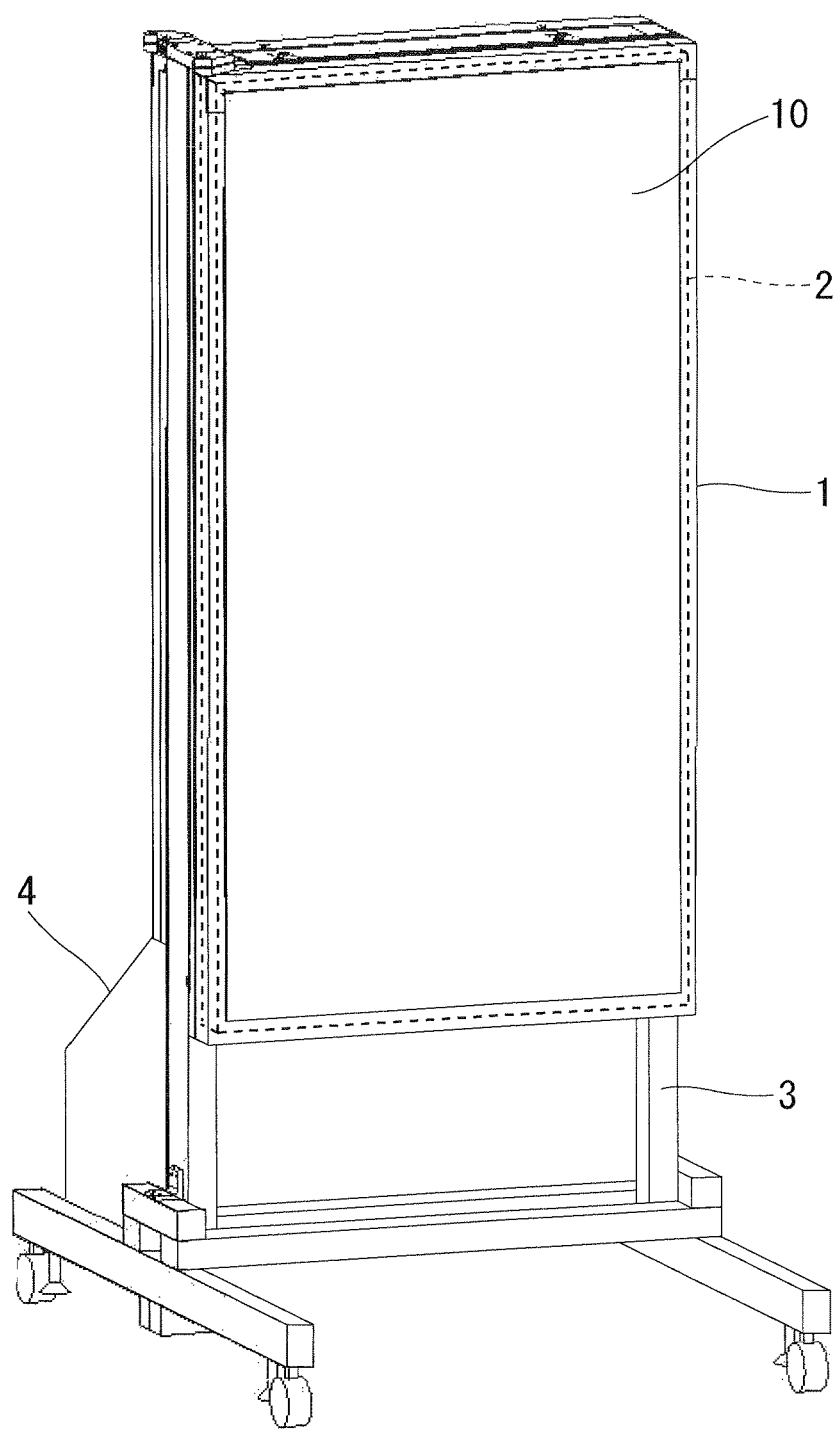
FIG. 1 is a perspective view of a display apparatus in accordance with an embodiment of the present invention seen from a front side.

As shown in FIG. 1, the display apparatus comprises a housing 1, a liquid crystal display panel 2 arranged in the housing 1, a support base 3 for supporting the housing 1, and a cooling device 4. The support base 3 has a caster attached thereto. The panel 2 utilizes a light emitting diode (LED) as a light source for image display.

Figure 2:
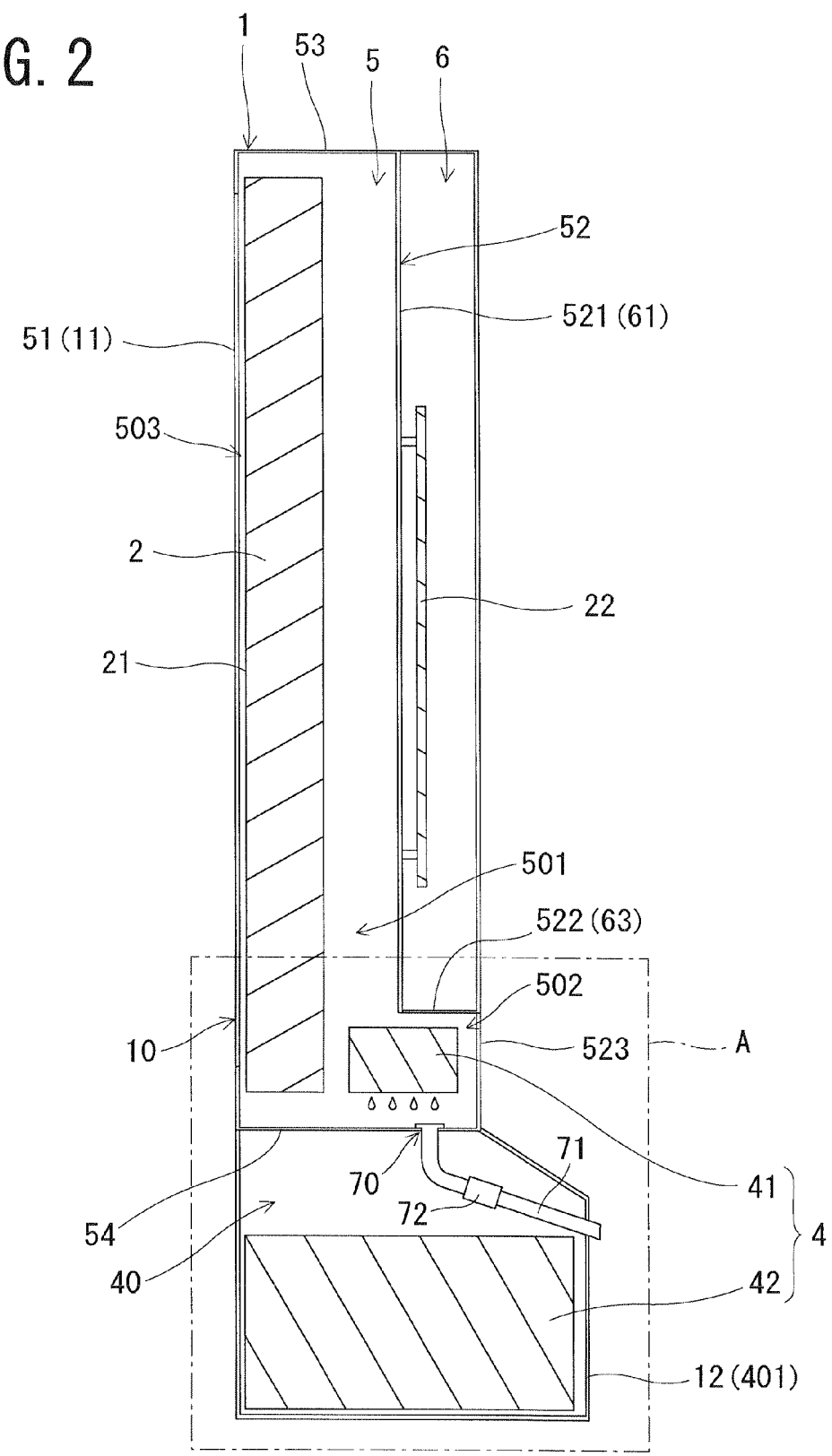
FIG. 2 is a vertical cross sectional view of the display apparatus.

As shown in FIG. 2, the housing 1 includes therein a first accommodation chamber 5 having a sealed structure and a second accommodation chamber 6 having a waterproofing structure. A front wall 51 of the chamber 5 is formed by a front wall 11 of the housing 1, and the wall 11 is made of an optically transparent material such as a glass material. In contrast, an upper wall 53, a bottom wall (lower wall), both side walls (i.e. left side wall and right side wall) and a rear wall 52 of the chamber 5 are made of a metal such as aluminum.

The wall 52 is constituted by a first vertical flat portion 521 extending downward from the wall 53 of the chamber 5, a horizontal flat portion 522 extending from a bottom end of the portion 521 to the rear side, and a second vertical flat portion 523 extending downward from a tip end of the portion 522. Therefore, the chamber 5 includes therein a first space 501 expanding along the wall 51 and a second space 502 expanding from a lower area of the space 501 to the rear side along the portion 522.

The chamber 5 accommodates the panel 2 in the space 501, and the panel 2 is arranged with its screen 21 facing the wall 11. Thus, as shown in FIGS. 1 and 2, a portion, where it face the screen 21, of the wall 11 forms an image display window 10 which makes the screen 21 viewable from outside of the housing 1. Therefore, the window 10 is made of the optically transparent material as well as the wall 11.

The chamber 5 includes therein a circulation channel 503 passing the front side and the rear side of the panel 2 so as to surround the panel 2. Specifically, the channel 503 passes through a space between the screen 21 and the window 10, as well as a space between a rear surface of the panel 2 and the wall 52.

The air inside the chamber 5 is circulated along the channel 503 by an operation of a fan provided in the chamber 5 (not illustrated in figures). Specifically, the fan blows the air to cool the panel 2. Therefore, when a lot of moisture is included inside the chamber 5, dew condensation is likely to occur on an inner surface of the window 10.

The chamber 6 is arranged on a rear side of the portion 521. A front wall 61 of the chamber 6 is formed by the portion 521, and a lower end surface 63 of the chamber 6 is formed by the portion 522. Therefore, the chamber 6 is arranged so as to align with the space 502 in a generally vertical direction. An upper wall, both side walls and a rear wall of the chamber 6 are made of a metal such as aluminum.

The chamber 6 accommodates therein a circuit board 22 controlling operation of the panel 2, and the board 22 is attached to a rear surface of the wall 61.

The housing 1 further includes therein a third accommodation chamber 40 arranged outside and below the chamber 5. A rear wall 401 of the chamber 40 is formed by a part of a rear wall 12 of the housing 1.

As shown in FIG. 2, the cooling device 4 includes an evaporator 41 and a condenser 42. The evaporator 41 is accommodated in the space 502 on the rear side of the panel 2, and the condenser 42 is accommodated in the chamber 40. The evaporator 41 and the condenser 42 are connected to each other through a pipe in which a refrigerant flows inside (not illustrated in figures). Therefore, heat inside the chamber 5 is collected by the evaporator 41 and the collected heat is released outside the chamber 5 by the condenser 42. Thus, the air inside the chamber 5 is cooled by the cooling device 4.

The cooling device 4 further includes a compressor (not shown) for compressing the refrigerant which flows from the evaporator 41 to the condenser 42. Therefore, a high-temperature and high-pressure refrigerant flows into the condenser 42. Accordingly, the heat collected by the evaporator 41 is efficiently eliminated by the condenser 42.

According to the display apparatus described above, the chamber 6 and the space 502 are arranged so as to align in a generally vertical direction. Therefore, the board 22 accommodated in the chamber 6 and the evaporator 41 accommodated in the space 502 are arranged so as to align in a generally vertical direction. Accordingly, the apparatus described above can have a smaller thickness compared to the display apparatus in which the evaporator is intervened between a liquid crystal display panel and a circuit board.

Figure 3:
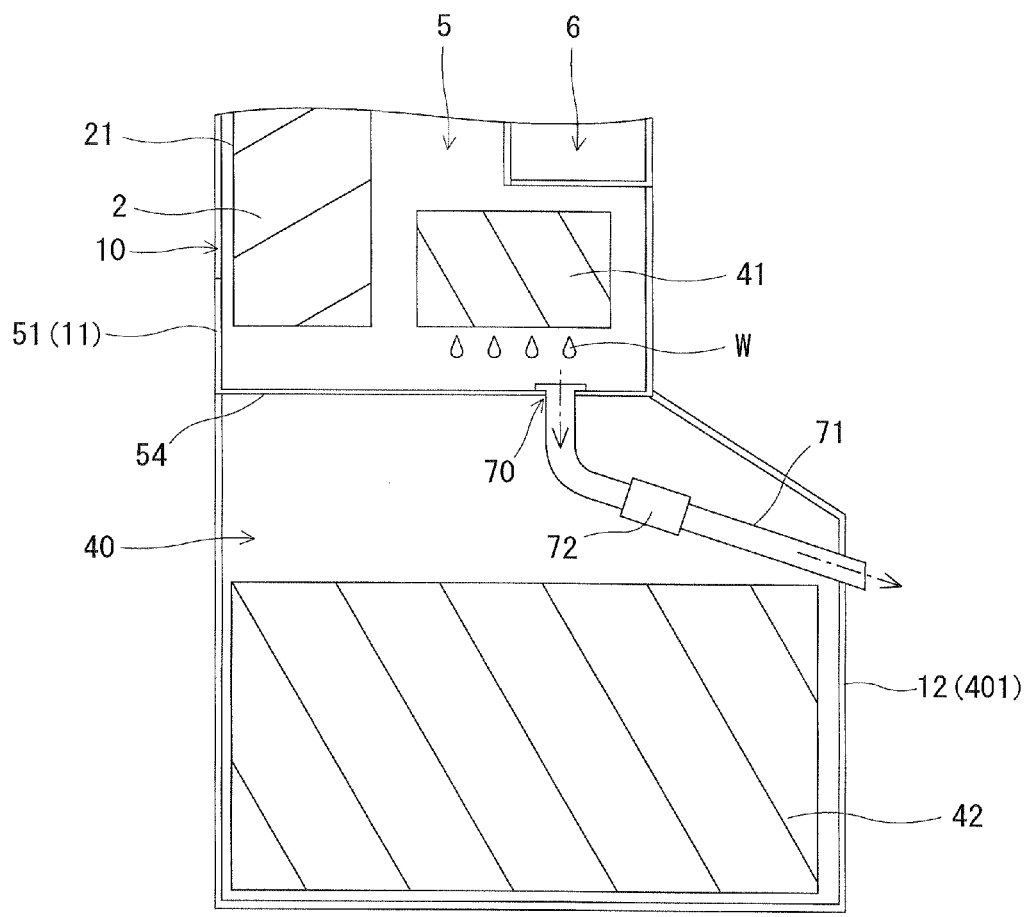
FIG. 3 is a cross sectional view of the area A shown in FIG. 2 in an enlarged manner.

As shown in FIG. 3, a bottom wall 54 of the chamber 5 is provided with a drain outlet 70. A drain pipe 71 extends from the outlet 70 and is provided with a check valve 72. The outlet 70 is arranged below the evaporator 41. The pipe 71 extends obliquely downward toward the wall 401, and a tip end part of the pipe 71 is drawn out from the housing 1.

According to the apparatus described above, since the panel 2 is accommodated in the chamber 5 having a sealed structure, the panel 2 does not contact outside air. Also, since the board 22 is accommodated in the chamber 6 having a waterproofing structure, the board 22 does not contact outside air easily. Therefore, even when the apparatus is installed outside, the panel 2 and the board 22 are protected from weather, dust and the like.

On the other hand, heat generated from the panel 2 stays inside the chamber 5 having a sealed structure, and thus the temperature in the chamber 5 tends to rise. Therefore, in the apparatus described above, the cooling device 4 is provided to cool the air inside the chamber 5. Therefore the temperature increase in the chamber 5 is inhibited.

Also, the air inside the chamber 5 is circulated along the channel 503 by an operation of the fan. Therefore, the cooled air inside the chamber 5 passes between the screen 21 and the window 10. Accordingly, the heat generated from the front side of the panel 2 is efficiently collected by the evaporator 41 utilizing the air inside the chamber 5.

As a result, temperature increase of the panel 2 is inhibited, and the function of the panel 2 is maintained in normal state.

Also, heat generated from the board 22 stays inside the chamber 6, and thus the temperature in the chamber 6 tends to rise. It is possible to inhibit temperature increase inside the chamber 6 by providing a cooling device for cooling the air inside the chamber 6 in the apparatus, for example by arranging a radiator fins on the rear side of the chamber 6, thereby preventing damage of the board 22 caused by heat.

When the air inside the chamber 5 is cooled by the cooling device 4, moisture included in the air inside the chamber 5 is condensed to dew drop on a surface of the evaporator 41, and dew condensed water W falls on an inner surface of the wall 54 as shown in FIG. 3.

According to the apparatus described above, as indicated by dashed line arrows in FIG. 3, the water W fallen on the inner surface of the wall 54 passes through the outlet 70 and then the pipe 71 to be emitted outside the chamber 5. The valve 72 prevents the air and moisture outside the chamber 5 from entering into the chamber 5 via the pipe 71, and thereby maintaining the sealed structure of the chamber 5. Thus, the water W is emitted outside the chamber 5 and the moisture in the chamber 5 is reduced, and further the air inside the chamber 5 is maintained in a state where the moisture is reduced thereafter. Accordingly, even when outdoor temperature becomes lower than the temperature inside the chamber 5, dew condensation hardly occurs on the inner surface of the window 10, and therefore the inner surface of the window 10 is hardly misted.

Figure 4:
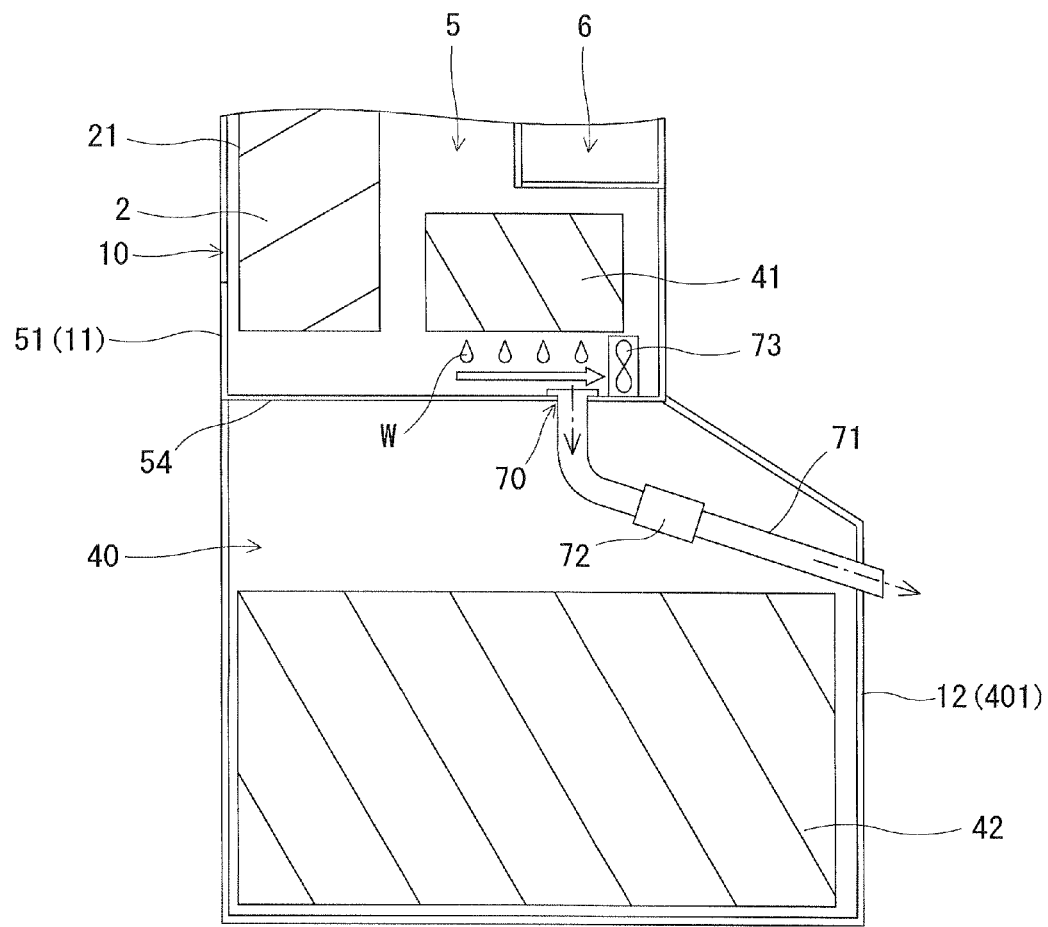
FIG. 4 is a cross sectional view of a modification of the display apparatus.

FIG. 4 is a cross sectional view of a modification of the apparatus described above. As shown in FIG. 4, the chamber 5 may further accommodate therein a fan 73 for moving the air inside the chamber 5 from an area below the evaporator 41 toward the outlet 70. The fan 73 is arranged near the outlet 70 with its intake side facing the area below the evaporator 41 and an area directly above the outlet 70. Therefore, as indicated by an outline arrow in FIG. 4, the air inside the chamber 5 flows from the area below the evaporator 41, through the area directly above the outlet 70, to the fan 73.

According to the modified apparatus, the water W generated on the surface of the evaporator 41 is led to the outlet 70 when it falls to the inner surface of the wall 54, or is led to the outlet 70 along the inner surface of the wall 54 after it falls on the inner surface, by the air flow generated by the fan 73. Thus, the water W is efficiently emitted outside the chamber 5.

The present invention is not limited to the foregoing embodiment in construction but can be modified variously within the technical range set forth in the appended claims. For example, the inner surface of the wall 54 may be provided with an inclined surface extending obliquely upward from the outlet 70. Thereby, the water W flows easily on the inclined surface to the outlet 70 due to gravity. Accordingly, the water W is easily emitted outside through the outlet 70 and the pipe 71.

Figure 5:
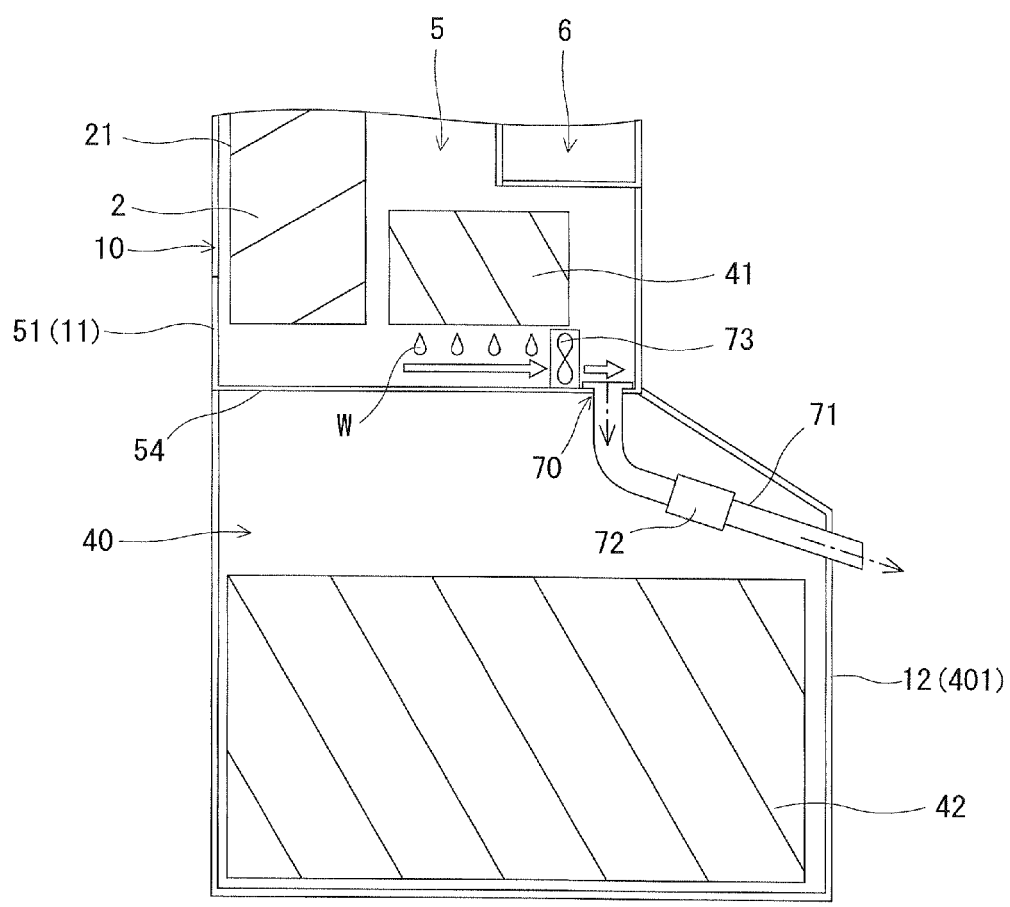
FIG. 5 is a cross sectional view of another modification of the display apparatus.

Further, according to the apparatus shown in FIG. 4, the fan 73 is arranged near the outlet 70 with its intake sides facing the area below the evaporator 41 and the area directly above the outlet 70. However, the present invention is not limited to this structure. The fan 73 may be arranged near the outlet 70 with its intake side facing the area below the evaporator 41 and its outlet side facing the area directly above the outlet 70 as shown in FIG. 5, for example. In this structure, the air inside the chamber 5 flows from the area below the evaporator 41, through the fan 73, to the area directly above the outlet 70. Therefore, the air inside the chamber 5 can flow from the area below the evaporator 41 toward the outlet 70 in this structure, and the water W generated on the surface of the evaporator 41 is efficiently led to the outlet 70 as well.

The constitution employed in the display apparatus described above can be applied not only to the display apparatus with the panel 2, but also to display apparatuses with various image display panels such as a plasma display, or an organic EL (Electro-Luminescence) display.

What is claimed is:

1. A display apparatus comprising:
    an accommodation chamber having a sealed structure;
    a display panel accommodated in the accommodation chamber;
    a cooling unit which cools the air inside the accommodation chamber;
    a drain pipe extending from a bottom part of the accommodation chamber; and
    a check valve provided in the drain pipe.

2. The display apparatus according to claim 1, further comprising a fan leading the air below the cooling part to an inlet of the drain pipe.

3. A display apparatus comprising:
    an accommodation chamber having a sealed structure;
    a display panel accommodated in the accommodation chamber;
    an evaporator which cools the air inside the accommodation chamber; and
    a drain outlet provided below the evaporator.

4. The display apparatus according to claim 3, further comprising a fan leading the air below the evaporator to the drain outlet.

* * * * *